(12) United States Patent
Kallio et al.

(10) Patent No.: US 7,141,914 B2
(45) Date of Patent: Nov. 28, 2006

(54) MICROMANIPULATOR INCLUDING PIEZOELECTRIC BENDERS

(75) Inventors: Pasi Kallio, Tampere (FI); Quan Zhou, Hangzhou (CN); Marek Novotny, Prague (CZ); Heikki Koivo, Kirkkonummi (FI); Johana Kuncova, Prague (CZ); Pekka Ronkanen, Tampere (FI); Juha Turunen, Tampere (FI)

(73) Assignee: Chip-Man Technologies Oy, Tampere (SE)

( * ) Notice: Subject to any disclaimer, the term of this patent is extended or adjusted under 35 U.S.C. 154(b) by 213 days.

(21) Appl. No.: 10/497,857

(22) PCT Filed: Nov. 29, 2002

(86) PCT No.: PCT/FI02/00964

§ 371 (c)(1),
(2), (4) Date: Jun. 7, 2004

(87) PCT Pub. No.: WO03/049908

PCT Pub. Date: Jun. 19, 2003

(65) Prior Publication Data

US 2005/0006986 A1 Jan. 13, 2005

(30) Foreign Application Priority Data

Dec. 7, 2001 (FI) .................................. 20012410
Sep. 10, 2002 (FI) .................................. 20021613

(51) Int. Cl.
*H02N 2/00* (2006.01)
(52) U.S. Cl. .................... 310/323.17; 310/323.18; 310/328; 310/330

(58) Field of Classification Search ..............
310/323.16–323.18, 328, 330–332
See application file for complete search history.

(56) References Cited

U.S. PATENT DOCUMENTS

| 4,520,570 | A | * | 6/1985 | Bednorz et al. | ............... | 33/613 |
| 4,785,177 | A |   | 11/1988 | Besocke | | |
| 5,055,760 | A |   | 10/1991 | Nashiki et al. | | |
| 5,229,679 | A |   | 7/1993 | Higuchi et al. | | |
| 5,266,801 | A | * | 11/1993 | Elings et al. | ............... | 250/306 |
| 6,992,422 | B1 | * | 1/2006 | Heaton et al. | ............... | 310/331 |
| 2003/0137777 | A1 | * | 7/2003 | Boutaghou et al. | ...... | 360/294.4 |

FOREIGN PATENT DOCUMENTS

| JP | 63-11070 | * | 1/1988 | ................. | 310/328 |
| JP | 4165966 | A | 6/1992 | | |
| JP | 9267278 | A | 10/1997 | | |
| JP | 11090867 | A | 4/1999 | | |
| JP | 2000-324862 | * | 11/2000 | | |

* cited by examiner

*Primary Examiner*—Thomas M. Dougherty
(74) *Attorney, Agent, or Firm*—Venable LLP; Eric J. Franklin (57) ABSTRACT

A micromanipulator for positioning/localization of an operating instrument coupled therewith. The micromanipulator controls movement of the operating instrument in a single- or multi-axial system of coordinates with one or more electrical actuators. The electrical actuators are especially for providing a substantially elongated structure for the micromanipulator. The one or more actuators including a piezoelectric bender enable the positioning/localization of the operating instrument for providing at least one desired direction of motion.

32 Claims, 10 Drawing Sheets

MICROMANIPULATOR INCLUDING PIEZOELECTRIC BENDERS

CROSS-REFERENCE TO RELATED APPLICATIONS

This application claims priority to Finnish patent application 20012410 filed 7 Dec. 2001 and Finnish patent application 20021613 filed 10 Sep. 2002 and is the national phase under 35 U.S.C. §371 of PCT/FI02/00964.

FIELD OF THE INVENTION

The invention relates to a micromanipulator, which is intended for the positioning/localization of an operating instrument coupled therewith, by controlling its movement in a single- or multi-axial system of coordinates, such as in the direction of an x-, y- and/or z-axis, by means of electrical actuators present in the micromanipulator, whereby, especially for providing a substantially elongated structure for the micromanipulator, one or more actuators enabling the positioning/localization of the operating instrument, for implementing at least one of its desired directions of motion, are provided in the way of a piezoelectric bender. Preferred application environments or targets for a micromanipulator of the invention include e.g. the manipulation of biological cells and cell cultures or tissues in the field of biotechnology, or else e.g. the manipulation, testing, and assembly of precision mechanical, electronic and/or optical appliances or components.

BACKGROUND OF THE INVENTION

At present, the above type of micromanipulators are typically used for example in the field of microscopes, the desired operating range for an operating instrument coupled with a micromanipulator being typically from 0,5 μm to 10 mm. With regard to all desired directions of motion for a micromanipulator, the solutions used today are primarily based on solutions implemented hydraulically or by using electric motors. One such solution is disclosed e.g. in Japanese patent publication 8323656, wherein the linear motion produced by electric motors applied in that context being transmitted from the rotating motion of a rotor by using a sufficiently high pitched rack-and-pinion arrangement. On the other hand, other solutions of the prior art make use of piezoelectric motors, which operate at ultrasonic frequency and which produce vibration wave as a result of activating electrically a piezoelectric material.

The type of solutions, described e.g. in the above-cited patent publication JP 8323656 and based, in principle, on highly conventional technology, have a drawback of not being able to provide integral units sufficiently compact in terms of operating several appliances. On the other hand, a drawback today in the latter type of piezoelectric motors operating at ultrasonic frequency concerns a sufficiently precise control of the motion produced thereby, which is why, at the present time, it is not yet possible in highly precise procedures to exploit this particular type of solutions with a sufficient reliability, especially in situations involving a change of load.

As a result of quite an undeveloped state of the art in current micromanipulator technology, the situation today is indeed such that, especially e.g. in microscope application, it is generally possible to use concurrently no more than two micromanipulators, which are positioned on the opposite sides of an operating target. Therefore, in the process of operating with various injectable media or providing a micromanipulator in different processes with various operating instruments, such as pipettes or needles, it is always necessary to disassemble some of the basic equipment when switching from one procedure to another, by additionally cleaning it, whenever necessary, before it can be replaced with a new medium or operating instrument needed next for each procedure. As a result, operating procedures based on the use of micromanipulators are today quite laborious and unnecessarily inefficient, because it is not possible to perform the work by utilizing a sufficient number of concurrently operable micromanipulators due to the problem with available space.

On the other hand, the published Japanese application 09-267278 and the corresponding published European application 09267278 disclose a micromanipulator construction, wherein, particularly for providing a substantially elongated micromanipulator structure, one or more of its actuators enabling the positioning/localization of an operating instrument, for affecting at least one of its desired directions of motion, are implemented in the way of piezoelectric benders. However, the solution disclosed in this context is based on piezoelectric benders connected in parallel on top of the external surface of the flexible operating frame of a micromanipulator, wherein the bending or deflection is a result of rotations/elongations of benders on the opposite sides due to potential differences. Thus, the solution requires extremely precise mathematical modelling because, for example, a deflection, occurring in just a single direction, necessitates a simultaneous control over all parallel-connected benders for providing a desired displacement or motion. On the other hand, an operating instrument, such as the tip of an injection needle, can be adapted to affect an axial motion by providing all benders with the same potential difference. In this case, the bender construction is further coupled pivotally with its actuator and, hence, each desired position for an operating instrument is extremely difficult to set in practice in a reliable and sufficiently accurate manner. Thus, only relatively small motions can be reliably provided by a solution of this particular type, especially in axial direction.

SUMMARY OF THE INVENTION

It is an object of the present invention to provide a decisive improvement regarding the above-mentioned problems and hence to raise essentially the existing state of the art. In order to fulfil this object, a micromanipulator of the invention is principally characterized in that the actuator, producing an axial direction of motion for the micromanipulator and located on the same longitudinal axis as a bender coupled therewith, is implemented in the way of a linear motor.

The most important benefits gained by a micromanipulator of the invention include the simplicity of its operating principle and constructions applicable thereto, especially by virtue of an optimally small space required by one or preferably several piezoelectric benders exploited in the invention, the axial direction of motion for the micromanipulator being especially implementable at a sufficient motion frequency/accuracy by means of a linear motor located on the same longitudinal axis as the piezoelectric bender. The piezoelectric bender used in a micromanipulator of the invention comprises in its most favorable embodiment a bi- or multimorph cantilever structure, which further enables an extremely simple construction, wherein each direction of motion is implementable by means of benders connected successively to each other on a common longitudinal axis and located in planes perpendicular to each other. Thus, by virtue of an elongated micromanipulator structure of the invention, it is possible to accommodate a sufficient number of micromanipulators for use e.g. in a microscope application, such that all media and operating instruments needed in a presently relevant process are prefit and ready in position in each micromanipulator previously focused in radial direction on an operating target. Hence, in this respect, a significant improvement is first of all attainable in the discussed type of work by avoiding all futile dismounting, cleaning and refitting operations. This means a marked improvement in productivity of work, resulting in a continuously proceeding operation to establish a comprehensively optimal operation by avoiding unnecessary standing times and delays.

Another essential benefit gained by a micromanipulator of the invention lies in the fact that it does not necessarily require precision micromechanics to the same extent as currently available solutions, since most of the motions produced by a micromanipulator are possible to achieve by utilizing piezoelectric materials, the rotation or elongation produced thereby being possible to monitor by the application of per se available technology in a manner enabling a continuous feedback control for the micromanipulator.

Preferred embodiments for a micromanipulator of the invention are set forth in the dependent claims directed thereto.

BRIEF DESCRIPTION OF THE DRAWINGS

The invention will be described in detail in the following specification with reference made to the accompanying drawings, in which.

DETAILED DESCRIPTION OF EMBODIMENTS OF THE INVENTION

Figure 1:
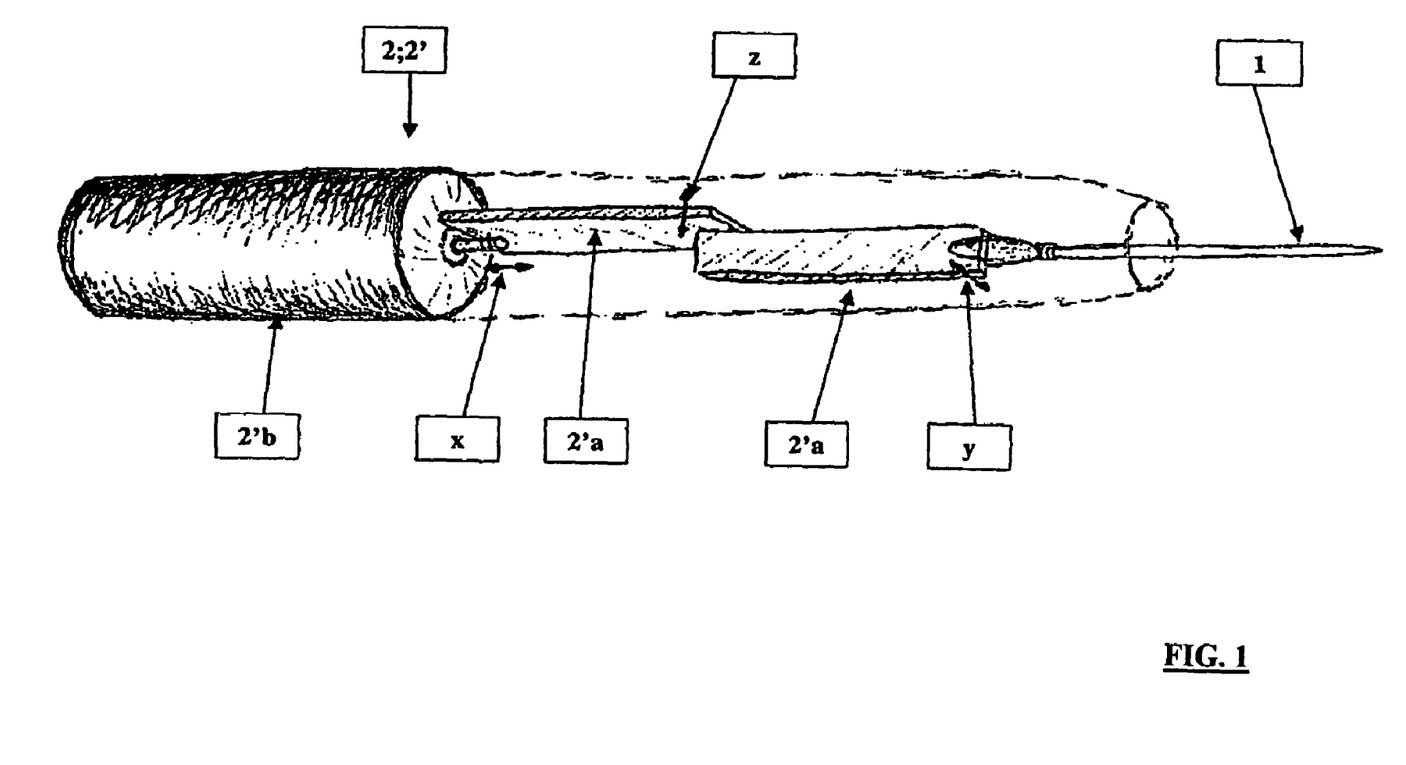
FIG. 1 shows in a perspective view one preferred basic configuration for an elongated micromanipulator of the invention.

The invention relates to a micromanipulator, which is intended for the positioning/localization of an operating instrument 1 coupled therewith, by controlling its movement in a single- or multi-axial system of coordinates, such as in the direction of an x-, y- and/or z-axis, by means of electrical actuators 2 present in the micromanipulator. Especially, for providing a substantially elongated structure for the micromanipulator, shown e.g. in FIG. 1 on a level of principle, one or more actuators 2; 2' enabling the positioning/localization of the operating instrument 1, for providing at least one of its desired directions of motion, are implemented in the way of a piezoelectric bender. In this context, the actuator 2; 2', producing an axial direction of motion x for the micromanipulator and located on the same longitudinal axis x as a bender 2'a coupled therewith, is implemented in the way of a linear motor 2'b.

In a particularly preferred application, with reference to the embodiments shown in FIGS. 1–5 and 7a/7b, the piezoelectric bender in all those comprises a bi- or multimorph cantilever structure. By virtue of subsequently described applications, this type of piezoelectric bender provides numerous benefits, such as a remarkably greater, practically even dozens of times greater extent and accuracy for a motion produced by the micromanipulator, as compared with traditional technology.

In the embodiments shown particularly in FIGS. 1, 2, 3, 5 and 7a/7b, the actuators 2; 2', affecting at least two directions of motion y, z for the micromanipulator, are implemented in the way of piezoelectric benders 2'a coupled successively with each other on a common longitudinal axis x and lying in planes perpendicular to each other. Thus, for example, the use of bimorph cantilever benders enables the implementation of each desired direction of motion unambiguously by no more than one bender, whereby the positioning of a micromanipulator occurring in this particular direction of motion is also possible to affect by controlling just one bender element.

Figure 5:
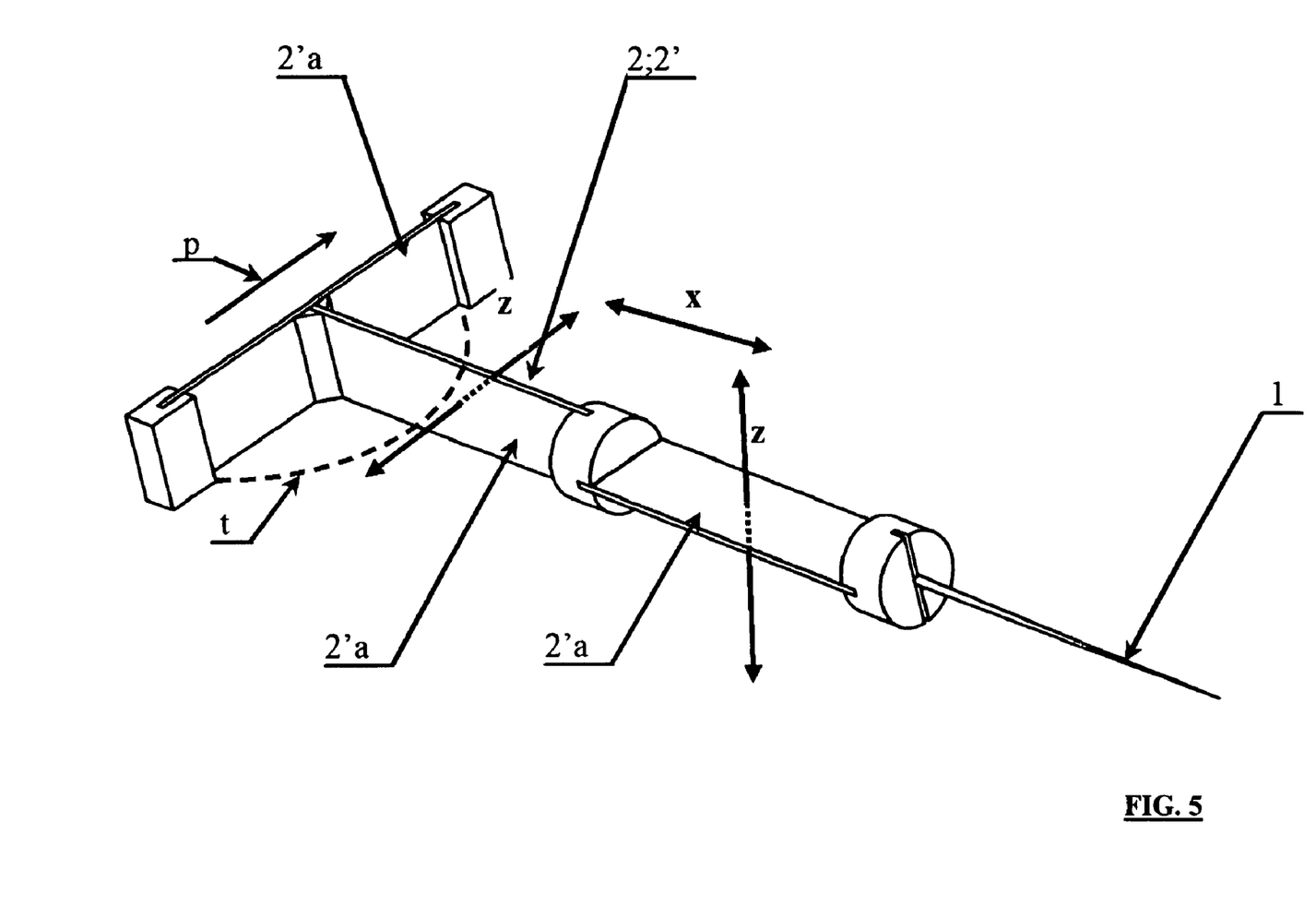
FIG. 5 shows further a micromanipulator alternative in certain aspects especially to the embodiments shown in FIGS. 2–4.

As a further preferred application in the embodiment of FIG. 5, the actuator 2; 2', affecting also an axial direction of motion x for the micromanipulator, is implemented in the way of a piezoelectric bender 2'a placed in a substantially crosswise direction p relative to the longitudinal axis x of the micromanipulator.

A solution alternative with respect to what is described above is, as shown in FIGS. 1, 2, 3 and 4, provided by a micromanipulator, which involves the use of at least one electric motor. As a preferred application in this context, the axial motion transmitted from a linear electric motor 2'b, which functions as an actuator, is further adapted to be fine adjusted, according to what is shown in FIGS. 3 and 4, by means of a piezoelectric stack actuator 2'c. In this context, the micromanipulator comprises e.g. a direct-current electric motor based on rotating motion, such as a miniature DC-motor or the like, which produces, by means of a transmission system included therein, an axial motion x linear to the voltage supplied therein.

In another preferred embodiment for a micromanipulator of the invention, each piezoelectric bender 2'a included therein is provided, as shown in FIG. 3, with monitoring or tracking elements 3, such as a strain gauge 3a or the like, particularly for obtaining feedback data regarding a movement of the discussed bender. On the other hand, this feedback also enables a continuous feedback control for the micromanipulator, by virtue of which it is possible to eliminate changing of the electrical characteristics of a piezoelectric material as a function of time.

Especially in the embodiment shown in FIG. 4, the micromanipulator is provided with at least one electric motor, such that the actuators affecting two directions of motion y, z for the micromanipulator are implemented in the way of longitudinally successive elements, including a direct-current electric motor 2'd, providing a rotation w', and the piezoelectric bender 2'a, coupled behind it in the axial direction x. Thus, the location for the tip of an operating instrument, such as an injection needle 1, in a 3D-space is mathematically definable exactly relative to a reference point on the basis of an axial displacement x, the rotation w' produced by the electric motor 2'd, and a deflection t of the bender 2'a, while in other alternative solutions the localization is based, in addition to the axial displacement x, on deflections of the benders 2'a in the direction of y- and z-axes.

In a preferred embodiment, the electric motor 2'b, 2'd, such as a miniature DC-motor or the like, is also provided with monitoring or tracking elements 3 for monitoring the axial motion x or the rotation w' transmitted therefrom, by means of a displacement 3b or rotary sensor, such as an LVDT-, PSD-, opto-electric linear or rotary encoder, a Hall sensor and/or the like. Of course, it is possible to provide a manipulator of the invention with stepping or pulse motors operating on respective technologies.

Figure 2:
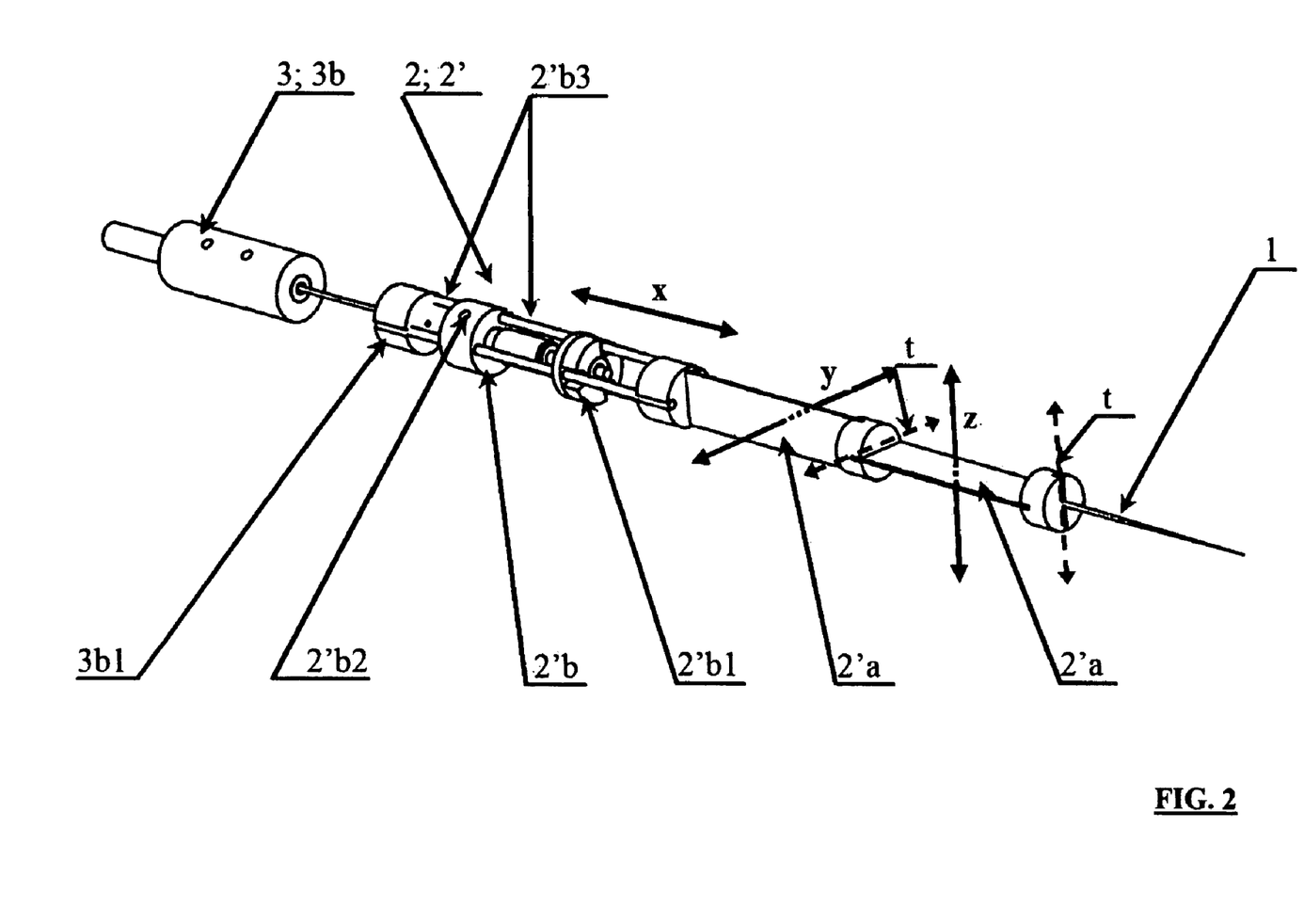
FIG. 2 shows in a perspective view one micromanipulator, developed further with respect to the embodiment shown in FIG. 1.
Figure 3:
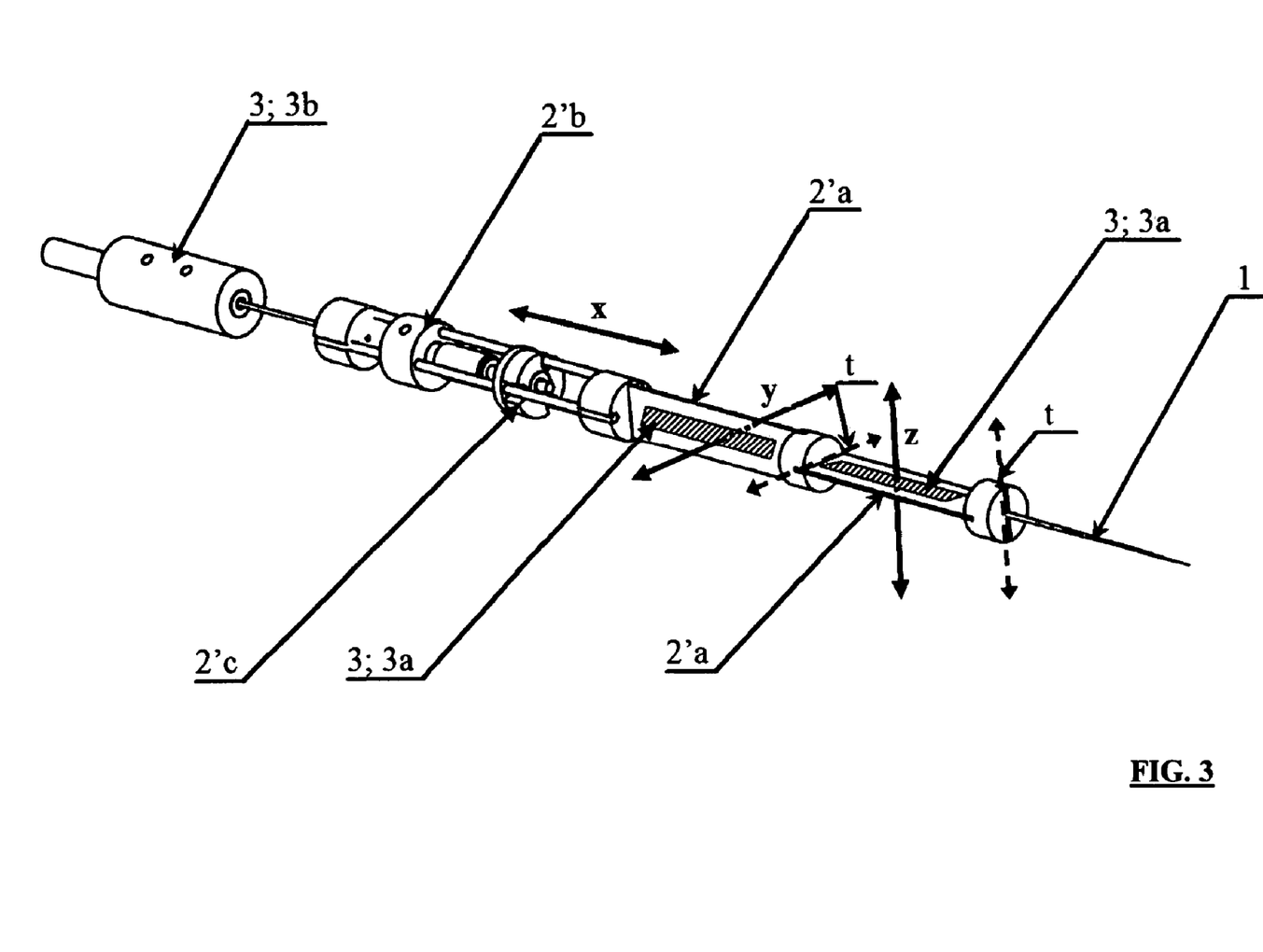
FIG. 3 shows, especially with respect to the embodiment shown in FIG. 2, a construction made more complete by way of an electric motor included therein.
Figure 4:
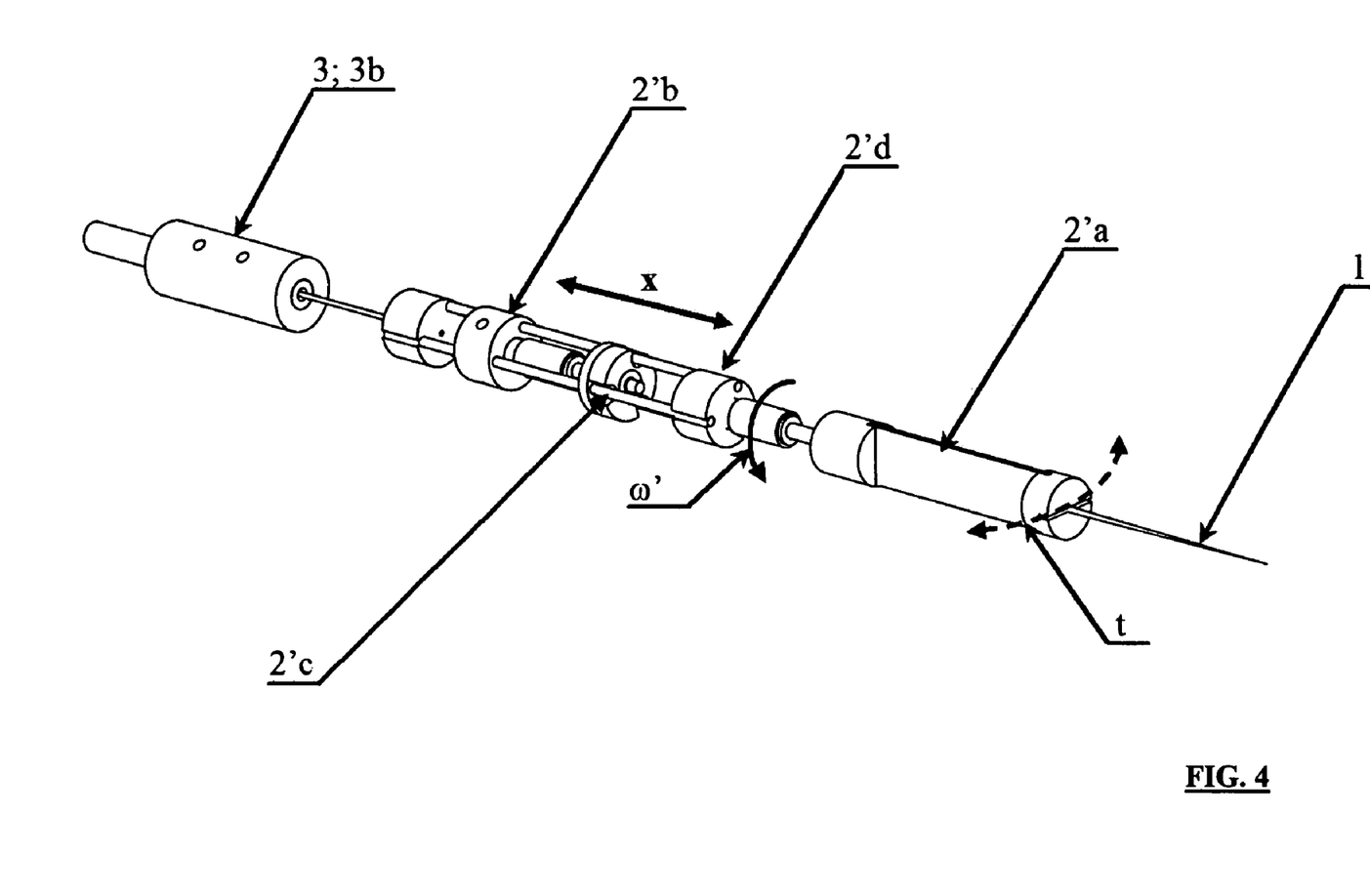
FIG. 4 shows a solution alternative in certain aspects especially to the embodiments shown in FIGS. 2 and 3.

In the preferred embodiments shown especially in FIGS. 2–4, the tracking elements 3; 3b monitoring the axially directed motion x provided by the electric motor 2'b are placed on the substantially common longitudinal axis x and on the opposite side of the electric motor 2'b relative to the operating instrument 1. Thus, particularly as presented in FIG. 2, the electric motor 2'b has its shaft disc 2'b1 fitted on the side opposite to the operating instrument 1 with a slide bar assembly 2'b3 extending through a motor frame 2'b2 for a sensor subframe 3b1 of the axially directed tracking elements 3; 3b. By virtue of the tracking elements 3 present in the micromanipulator, it is possible to confirm the localization of each position of the operating instrument's 1 critical point and, if necessary, to make changes by electrically controlling an appropriate actuator. Especially by virtue of strain gauges 3a used in connection with piezoelectric benders 2'a, it is also possible to sustain a continuous feedback control for the micromanipulator, which also enables avoidance of operational inaccuracies resulting from a hysteresis effect typical for piezoelectric materials.

In this context, there is a recognized need to further develop the accuracy of an axially directed displacement or motion produced especially by a micromanipulator of the above type, which is not as such implementable satisfactorily in the control of a micromanipulator of the above merely by the application of conventional motion control mechanics and automatics. Therefore, a micromanipulator of the invention is further designed to exploit a control arrangement, intended for improving the straightness and flatness of an axially directed motion x produced particularly by the micromanipulator and comprising a substantially axially arranged, antifriction-bearing mounted slide assembly L.

Figure 10A:
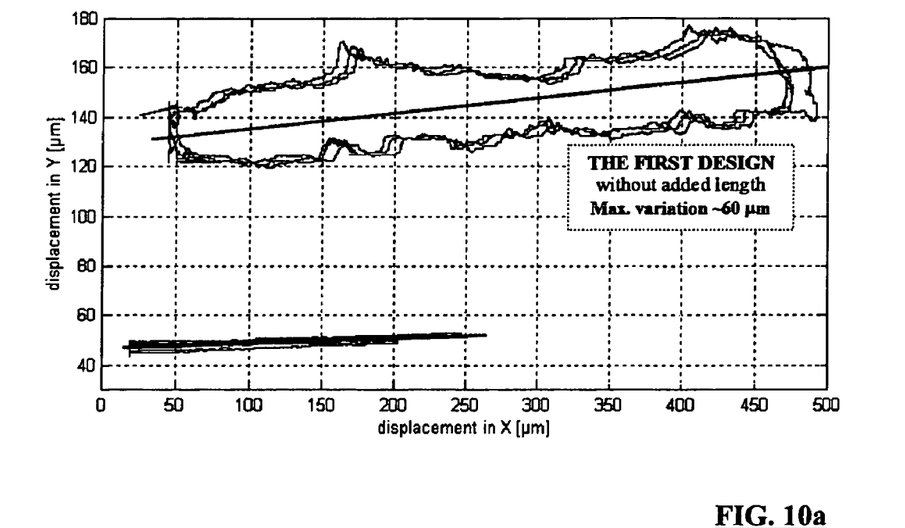
FIGS. 10a and 10b illustrate an axial displacement accuracy for a micromanipulator without a control arrangement (FIG. 10a) and, on the other hand, an axial displacement accuracy for a micromanipulator provided with a control arrangement (FIG. 10b).
Figure 10B:
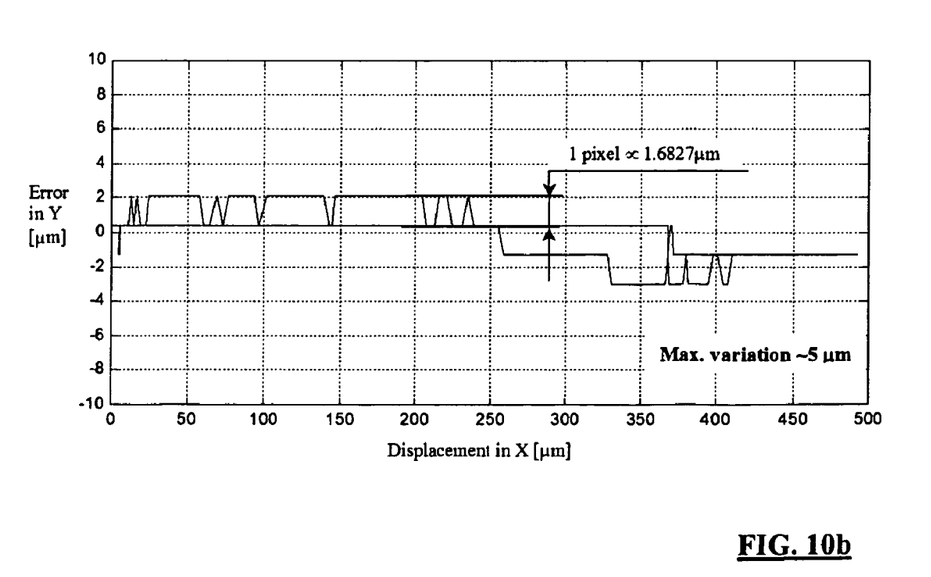

The most important benefits gained by such a control arrangement include especially an improvement provided thereby with regard to the straight-line accuracy of a micromanipulator. The antifriction-bearing mounted slide assembly, such as e.g. a ball- or roller-bearing mounted axial bearing, further enables a preferably elongated structure for the micromanipulator, wherein its lengthwise movement, especially, is controllable remarkably more accurately than in any of the existing prior solutions. Particularly, the comparison of a micromanipulator, implemented by means of piezoelectric benders and making use of conventional control arrangement, with its counterpart provided with a control arrangement of the invention, reveals clearly, e.g. on the basis of tables shown in FIGS. 10a and 10b, that the accuracy of an axially directed motion has improved many times over by virtue of a presently developed control arrangement. In a micromanipulator consistent with the original construction, the variation of motion accuracy is at its maximum about 60 µm, while the discussed control arrangement enables bringing it down to a maximum of about 5 µm. Thus, the discussed control arrangement provides a possibility of implementing even more-than-before accurate positioning for a micromanipulator, which carries an essential significance in procedures which require precise operating.

Figure 6:
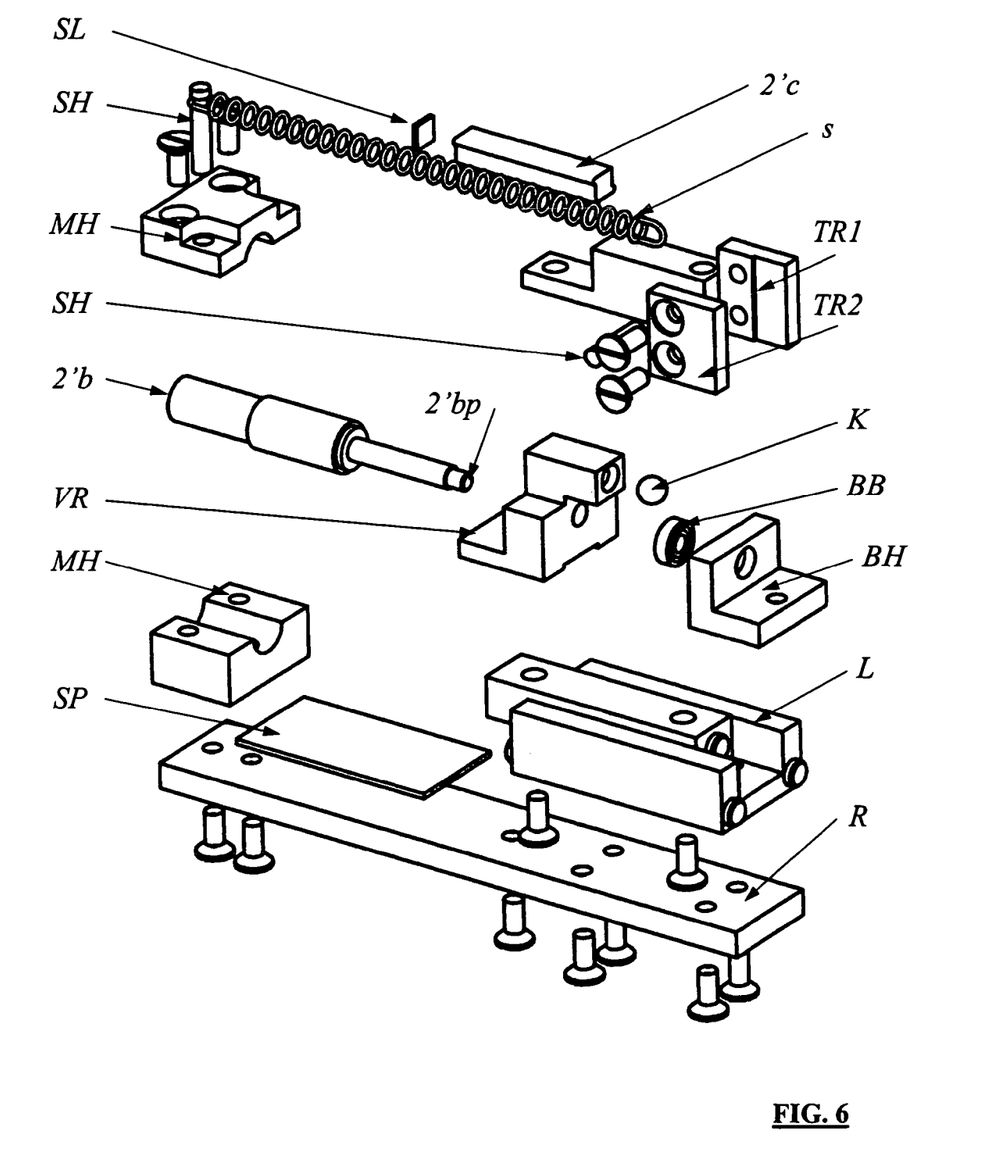
FIG. 6 shows in an exploded view one preferred subassembly for a micromanipulator, which is provided with a so-called control arrangement as a preferred application of the invention.

In a preferred embodiment of the invention, the actuator, producing an axially directed motion x of the micromanipulator and located on the same longitudinal axis x as a piezoelectric bender 2'a coupled therewith as shown e.g. in FIG. 6, is implemented in the way of an electric motor 2'b, the axially directed motion transmitted therefrom being adapted to be fine adjusted by means of a piezoelectric stack actuator 2'c. Between an end 2'bp of the electric motor's 2'b axially directed x shaft and the stack actuator 2'c is provided at least a focusing means K, such as a ball or the like, for the controlled focusing on a spot contact principle of a force existing between the discussed elements. Especially in the embodiment shown in FIG. 6, in connection with the end of a motor's shaft is provided an intermediate frame VR for translating a rotating motion of the axial motor's shaft to an axially directed motion. In this type of solution, the above-mentioned ball K is positioned on a counter-surface present therein in view of transmitting a spot contact to the stack actuator 2'c by way of a silicon plate SL in a further preferred embodiment.

Furthermore, the elements represented by reference numerals SH in FIG. 6 are particularly intended for the attachment of a spring S. Moreover, the components represented by reference numerals MH are holders for an electric motor 2'b, which are secured to each other by a jack-screw system. On the other hand, the element represented by reference numeral SP is a silicon panel, the purpose of which is to reduce a kinetic friction of the intermediate frame VR. Reference character R refers to a base plate for the micromanipulator, and reference characters BH represent a bracket integrated therewith, by means of which a radial bearing for the electric motor's shaft is secured in place. Elements TR1 and TR2, in turn, represent mounting plates intended for the attachment of a piezoelectric bender 2'a used in a type of solution depicted in FIGS. 7a and 7b.

Figure 7A:
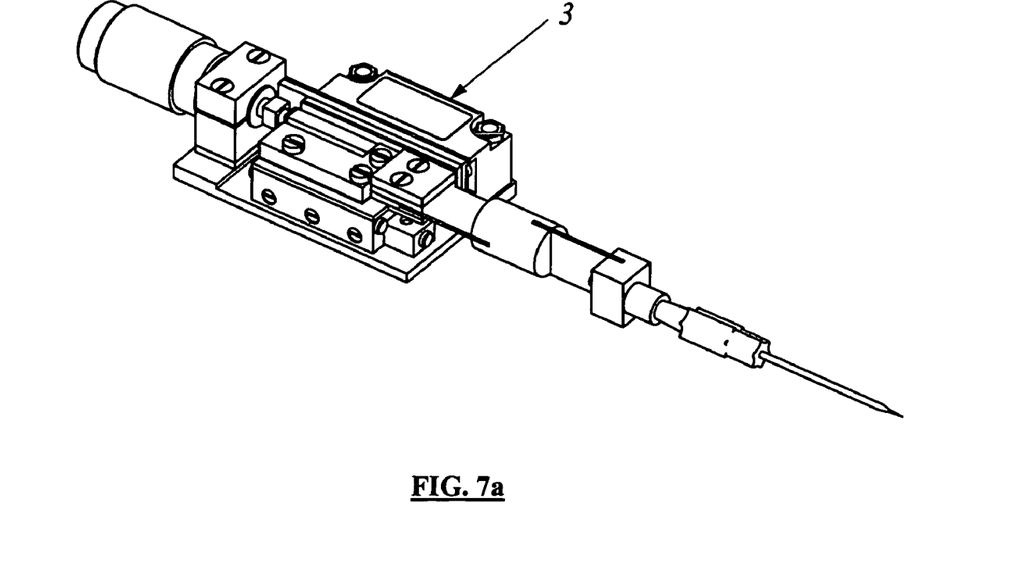
FIGS. 7a and 7b show further one preferred micromanipulator provided with a control arrangement and in its axially extreme positions.
Figure 7B:
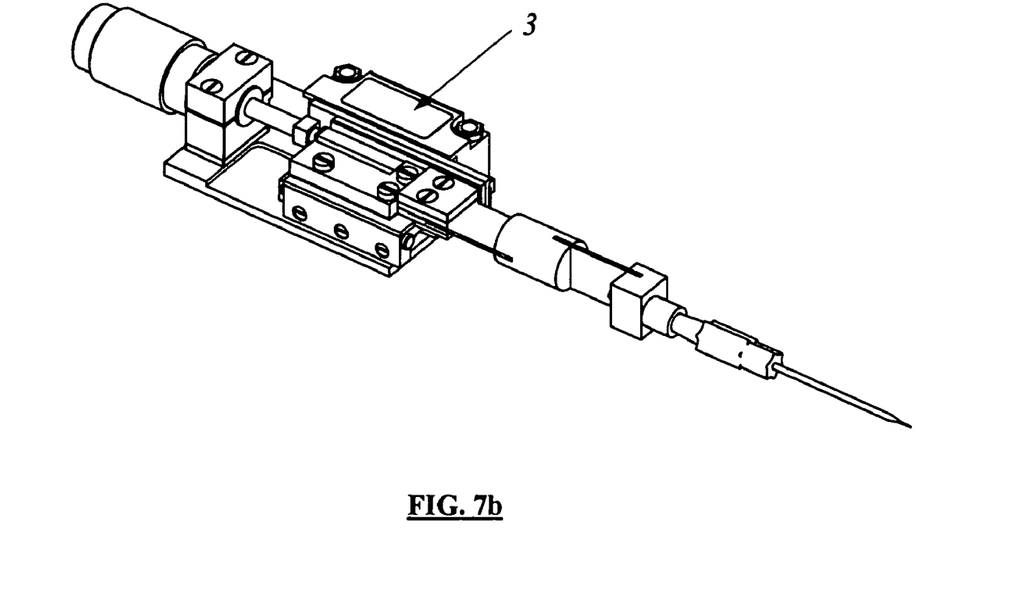

In yet another preferred embodiment for a micromanipulator of the invention, its control arrangement further comprises mechanical elastic members s, such as one or more spring, elastic polymer, silicone absorbers and/or the like, particularly for eliminating the effects of inertial forces, friction, clearances and/or the like. Unlike the spring mechanism used in the embodiment of FIG. 6, the type of solution shown in FIGS. 7a and 7b is implemented by using an elastic polymer absorber, whose position is not, however, clearly visible in FIGS. 7a and 7b. The construction of FIGS. 7a and 7b is also in some other respects different from the embodiment shown in FIG. 6, as the former employs e.g. tracking elements 3 for monitoring an axial motion x or a rotation of the electric motor's shaft, e.g. by means of a displacement or rotation sensor, such as an LVDT, PSD, opto-electric linear or rotary encoder, a Hall sensor and/or the like.

Figure 8A:
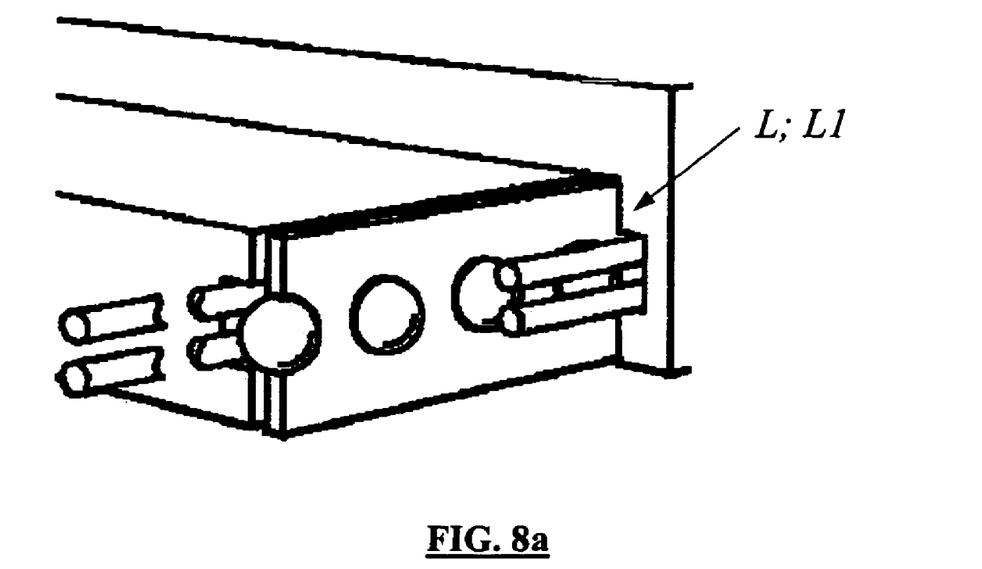
FIGS. 8a and 8b show two optional embodiments for an antifriction-bearing mounted slide assembly included in a micromanipulator control arrangement.
Figure 8B:
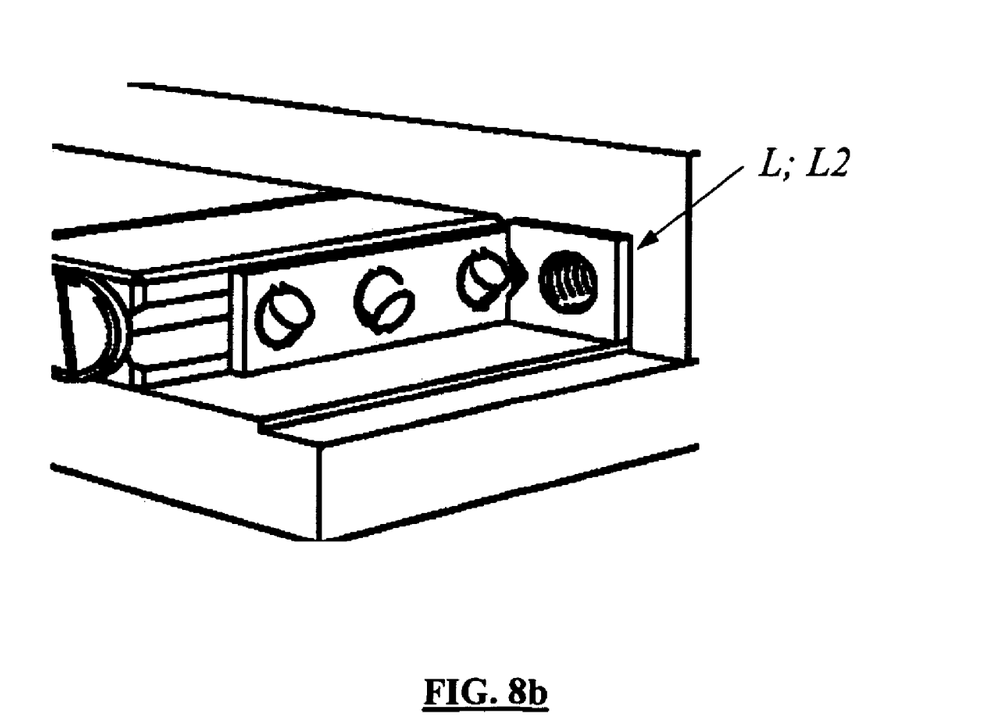
Figure 9:
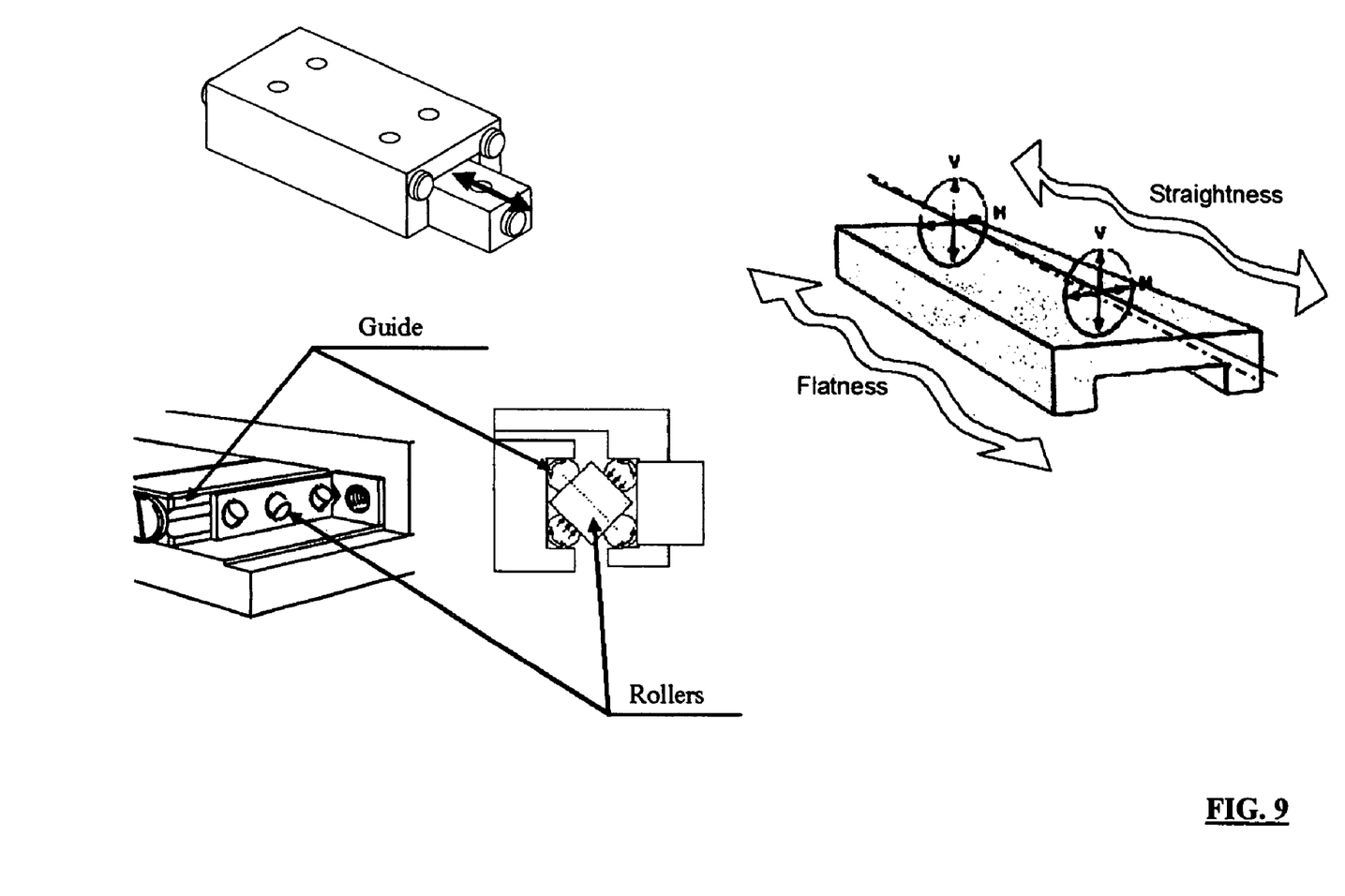
FIG. 9 illustrates a general operating principle for a crossed roller bearing, provided with a roller-bearing mounted slide and applicable to a micromanipulator control arrangement.

In a particularly preferred embodiment, the antifriction-bearing mounted slide assembly L is implemented by means of an axial bearing L1 provided with a ball bearing slide as depicted by way of example in FIG. 8a. On the other hand, the antifriction-bearing mounted slide assembly L is also implementable by means of an axial bearing L2 provided with a crossed roller bearing as shown e.g. in FIG. 8b.

In an especially preferred embodiment, the electric motor 2'b included in the micromanipulator comprises a stepping or pulse motor for providing a simplified micromanipulator construction, as shown especially in FIG. 6, which does not require so-called feedback positional sensing.

Another option in connection with the control arrangement is that the micromanipulator motor comprises e.g. a piezoelectric motor or else, as a further option, a motor manufactured from a magnetic shape memory material. Motors of the above-described type are not depicted in the attached drawings.

Especially in the solution shown e.g. in FIG. 2, the tracking elements 3; 3b monitoring an axially directed motion x provided by an electric motor 2'b are placed on a substantially common longitudinal axis x and on the opposite side of the electric motor 2'b relative to an operating instrument 1. Thus, the electric motor 2'b has its shaft disc 2'b1 fitted on the side opposite to the operating instrument 1 with a slide bar assembly 2'b3 extending through a motor frame 2'b2 for a sensor subframe 3b1 of the axially directed tracking element 3; 3b. Especially, when comparing the control arrangement fitted micromanipulators shown in FIGS. 6 and 7a, 7b with the solution shown in FIG. 2, it is evident that the invention provides an extremely simply affected stabilization regarding the axially directed motion of a micromanipulator, which is implemented by means of a relative antifriction-bearing mounted slide assembly between frame elements included integrally in the micromanipulator frame and movable components included therein.

It is obvious that the invention is not limited to applications illustrated or described above, but it can be modified within the scope of the basic inventional concept to fit any given demands and service applications. Firstly, it is naturally obvious that, instead of an injection needle as described above, the operating instrument connectable to the micromanipulator can be e.g. any mechanical actuator suitable for a particular operating procedure, such as a gripper or the like, which is attached by appropriate means to the end of a piezoelectric bender. In some of the described embodiments, all inter-component couplings are implemented by means of intermediate subframes, but in this context it is naturally also possible to utilize partially dismountable engagement arrangements, such that e.g. piezoelectric benders are replaceable. It is of course obvious that e.g. a process medium, used in association with each relevant operating instrument, can be delivered by conventional methods to make contact therewith and, hence, this aspect, being an irrelevant issue as such, has not been discussed in this application.

The invention claimed is:

1. A micromanipulator for positioning/localization of an operating instrument coupled therewith, by controlling movement in a single- or multi-axial system of coordinates, the micromanipulator comprising:
    an actuator operative to produce movements in an axial direction of the micromanipulator; and
    at least two piezoelectric benders lying in essentially different planes and operative to produce movements in the different planes, the at least two piezoelectric benders being coupled successively with each other and the actuator on a common longitudinal axis,
    wherein the actuator and at least two piezoelectric benders enable the positioning/localization of the operating instrument.

2. The micromanipulator according to claim 1, wherein the micromanipulator controls movement in an x-, y- and/or z-axis.

3. The micromanipulator according to claim 1, wherein the actuator and at least two piezoelectric benders are arranged to provide a substantially elongated structure for the micromanipulator.

4. The micromanipulator according to claim 1, wherein the at least two piezoelectric benders each comprise a bi- or multi-morph cantilever structure.

5. The micromanipulator according to claim 4, wherein the at least two piezoelectric benders affect at least two directions of motion for the micromanipulator and are coupled successively with each other on a common longitudinal axis and lie in planes perpendicular to each other.

6. The micromanipulator according to claim 1, wherein the actuator comprises a piezoelectric bender placed in a substantially crosswise direction relative to the longitudinal axis of the micromanipulator.

7. The micromanipulator according to claim 1, wherein the actuator comprises a linear electric motor, the micromanipulator further comprising:
    a piezoelectric stack actuator operative to finely adjust axially directed motion transmitted from the linear electric motor.

8. The micromanipulator according to claim 7, further comprising:
    a direct-current electric motor based on rotating motion and operative to produce an axial motion in a linear relationship to a voltage supplied to the motor.

9. The micromanipulator according to claim 8, wherein the direct-current electric motor comprises a miniature DC-motor.

10. The micromanipulator according to claim 1, further comprising:
    a tracking element associated with each piezoelectric bender, each tracking element being operative to obtain feedback data regarding a movement of the piezoelectric bender for enabling a continuous feedback control for the micromanipulator.

11. The micromanipulator according to claim 10, wherein each tracking element comprises a strain gauge.

12. The micromanipulator according to claim 1, further comprising:
    a direct-current electric motor operative to rotate the operating instrument.

13. The micromanipulator according to claim 7, further comprising:
    tracking elements comprising a sensor operative to monitor axial motion or rotation transmitted by the actuator.

14. The micromanipulator according to claim 13, wherein the actuator comprises a miniature DC-motor.

15. The micromanipulator according to claim 13, wherein the sensor comprises a displacement or rotary sensor.

16. The micromanipulator according to claim 13, wherein the sensor comprises at least one of an LVDT-, PSD-, opto-electric linear or rotary encoder, or a Hall sensor.

17. The micromanipulator according to claim 13, wherein the tracking elements are operative to monitor the axially directed motion provided by the actuator and are substantially arranged on the common longitudinal axis and on a side of the actuator opposite to the operating instrument, and wherein the actuator comprises a linear electric motor, a motor frame, a shaft disc fitted on the side of the linear electric motor opposite to the operating instrument, and a slide bar assembly extending through the motor frame for a sensor subframe of the tracking elements.

18. The micromanipulator according to claim 1, further comprising:
 a control arrangement operative to improve a straightness and flatness of motion produced by the micromanipulator in an axial direction.

19. The micromanipulator according to claim 18, wherein the control arrangement comprises an antifriction-bearing mounted slide assembly arranged substantially in the axial direction.

20. The micromanipulator according to claim 18, further comprising:
 focusing means operative to controllably focus a force arranged between an end of an axially directed shaft of the actuator and the stack actuator.

21. The micromanipulator according to claim 20, wherein the controlled focusing is carried out on a spot contact principle.

22. The micromanipulator according to claim 20, wherein the focusing means comprises a ball.

23. The micromanipulator according to claim 19, wherein the micromanipulator control arrangement comprises at least one mechanical elastic member.

24. The micromanipulator according to claim 23, wherein the at least one mechanical elastic member comprises at least one spring, elastic polymer, or silicone absorber.

25. The micromanipulator according to claim 23, wherein the at least one mechanical elastic member is operative to eliminate at least one of effects of inertial forces, friction, or clearances.

26. The micromanipulator according to claim 19, wherein the anti friction-bearing mounted slide assembly comprises an axial bearing including a ball bearing slide.

27. The micromanipulator according to claim 19, wherein the antifriction-bearing mounted slide assembly comprises an axial bearing provided with a crossed roller bearing.

28. The micromanipulator according to claim 1, wherein the actuator comprises comprises a stepping or pulse motor.

29. The micromanipulator according to claim 1, wherein the actuator comprises a piezoelectric motor.

30. The micromanipulator according to claim 1, wherein the actuator is manufactured from a magnetic shape memory material.

31. The micromanipulator according to claim 1, wherein the actuator comprises an electric motor.

32. A micromanipulator for positioning/localization of an operating instrument coupled therewith, by controlling movement in a single- or multi-axial system of coordinates, the micromanipulator comprising:
 an linear electric motor operative to produce movements in an axial direction of the micromanipulator; and
 at least two piezoelectric benders lying in essentially different planes and operative to produce movements in the different planes, the at least two piezoelectric benders being coupled successively with each other and the actuator on a common longitudinal axis,
 wherein the actuator and at least two piezoelectric benders enable the positioning/localization of the operating instrument.

* * * * *